(12) United States Patent
Vagher et al.

(10) Patent No.: US 7,023,278 B1
(45) Date of Patent: Apr. 4, 2006

(54) DIGITAL POWER AMPLIFIER LEVEL CONTROL

(75) Inventors: Michael R. Vagher, Vinton, IA (US); Clayton Harmon, Cedar Rapids, IA (US); Andrew J. Wiebold, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 52 days.

(21) Appl. No.: 10/946,083

(22) Filed: Sep. 21, 2004

(51) Int. Cl.
*H03G 3/10* (2006.01)

(52) U.S. Cl. ............... 330/284; 330/293; 330/279
(58) Field of Classification Search ............. 330/284, 330/293, 278, 279
See application file for complete search history.

(56) References Cited

U.S. PATENT DOCUMENTS

| | | | | |
|---|---|---|---|---|
| 5,646,578 A | * | 7/1997 | Loh et al. ............... | 330/279 |
| 5,977,831 A | * | 11/1999 | Davis et al. ............ | 330/279 |
| 6,580,901 B1 | * | 6/2003 | Mochizuki ............ | 455/127.1 |
| 6,759,902 B1 | * | 7/2004 | Kossor ................... | 330/136 |
| 2004/0219944 A1 | * | 11/2004 | Barak et al. ............ | 455/522 |

* cited by examiner

*Primary Examiner*—Patricia Nguyen
(74) *Attorney, Agent, or Firm*—Nathan O. Jensen; Kyle Eppele

(57) ABSTRACT

A digital power amplifier with variable output power control is disclosed. An amplifying stage includes a first attenuator that applies one of n attenuation steps to an RF signal in response to a desired output power level of the digital power amplifier. A feedback loop provides a gain control signal to the amplifying stage based upon an output of the amplifying stage. The feedback loop includes a second attenuator that applies another of the n attenuation steps to a sample of the output of the amplifying stage. The second attenuator applies the $k^{th}$ highest of the n attenuation steps when the first attenuator applies the $k^{th}$ lowest of the n attenuation steps, where $1 \leq k \leq n$.

20 Claims, 4 Drawing Sheets

| 42 | | 54 | |
|---|---|---|---|
| bin | dec | bin | dec |
| 00000 | 0 | 11111 | 31 |
| 00001 | 1 | 11110 | 30 |
| 00010 | 2 | 11101 | 29 |
| . | . | . | . |
| . | . | . | . |
| . | . | . | . |
| . | . | . | . |
| . | . | . | . |
| 11101 | 29 | 00010 | 2 |
| 11110 | 30 | 00001 | 1 |
| 11111 | 31 | 00000 | 0 |

FIG. 2

DIGITAL POWER AMPLIFIER LEVEL CONTROL

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of contract No. F33615-01-C-1856 awarded by DARPA.

FIELD OF THE INVENTION

The invention relates to communications technology, and more particularly, to power amplifiers used in communications receivers and/or transmitters.

BACKGROUND OF THE INVENTION

High-power digital amplifiers used in communications networks may have requirements to provide several peak power levels to adjust for range and to provide low power modes. In some types of networks, reverse channels are available that provide information to adjust the transmitter peak level to match the desired range such that four or more peak power levels are achieved. The range of required power levels required to be provided by a power amplifier may extend down 30 dB or more from the maximum power level.

One approach to establish multiple power levels is to provide an attenuator for each desired level of attenuation. FIG. 4 shows a portion of a power amplifier in which a pair of two-way switches 10, 11 selectively toggle an RF input 12 between a final amplifier stage 14 and a parallel array of attenuators 16. A pair of 3-way switches 18, 20 selectively toggle between a path 22 with little or no attenuation, a path including a first attenuator 24, and a path including a second attenuator 26. By controlling two-way switches 10, 11 and three-way switches 18, 20, a power output 28 can be provided with four levels of attenuation. However, these switches require high-power PIN diodes and drivers, and a large area is needed to place such components in a circuit. Furthermore, each attenuation level requires a separate high-power attenuator, with additional desired attenuation levels requiring more attenuators. Lastly, input signals of varying strengths may compromise the performance of the attenuators, resulting in unpredictable output power levels. For these reasons, the attenuation strategy as depicted in FIG. 4 may create unrealistic power and cooling requirements for portable communications devices.

It is therefore an object of the invention to provide a digital power amplifier usable at multiple power levels while using a minimum of high-power control components.

It is also an object of the invention to provide such a digital power amplifier that is usable with a wide range of strengths of input power signals.

A feature of the invention is a first digital control attenuator coupled with a second digital control attenuator that supplies an inversely proportional attenuation control level in a gain control loop of the digital power amplifier.

An advantage of the invention is the providing of multiple output power levels with a minimum number of high-power components in its design.

SUMMARY OF THE INVENTION

The invention provides a digital power amplifier. An amplifying stage includes a first attenuator that applies one of n attenuation steps to an RF signal in response to a desired output power level of the digital power amplifier. A feedback loop provides a gain control signal to the amplifying stage based upon an output of the amplifying stage. The feedback loop includes a second attenuator that applies another of the n attenuation steps to a sample of the output of the amplifying stage. The second attenuator applies the $k^{th}$ highest of the n attenuation steps when the first attenuator applies the $k^{th}$ lowest of the n attenuation steps, where $1 \leq k \leq n$.

The invention also provides a digital power amplifier with variable output power control where the amplifier includes means for amplifying an RF signal, including a first means for attenuating the RF signal. The first means for attenuating applies one of n attenuation steps to the RF signal in response to a desired output power level of the digital power amplifier. Means are supplied for providing gain control to the means for amplifying. The means for providing gain control is based upon an output of the means for amplifying. The means for providing gain control includes a second means for attenuating that applies another of the n attenuation steps to a sample of the output of the means for amplifying. The second means for attenuating applies the $k^{th}$ highest of the n attenuation steps when the first means for attenuating applies the $k^{th}$ lowest of the n attenuation steps, where $1 \leq k \leq n$.

The invention further provides a method of controlling an output power level of a digital power amplifier. The method includes amplifying an RF signal using at least one gain controlling element. While amplifying the RF signal, a first attenuation is applied to the RF signal with one of n attenuation steps in response to a desired output power level. A gain control signal, based upon an output of the amplifying step, is provided to one of the at least one gain controlling elements. Providing the gain control signal includes applying a second attenuation to a sample of the output of the amplifying step using another of the n attenuation steps. The applying of the second attenuation operates to apply the $k^{th}$ highest of the n attenuation steps when the applying of the first attenuation operates to apply the $k^{th}$ lowest of the n attenuation steps, where $1 \leq k \leq n$.

BRIEF DESCRIPTION OF THE DRAWINGS

FIG. 2 is a table showing attenuation levels to be supplied by digitally controlled attenuators according to the invention.

DETAILED DESCRIPTION OF THE DRAWINGS

Figure 1:
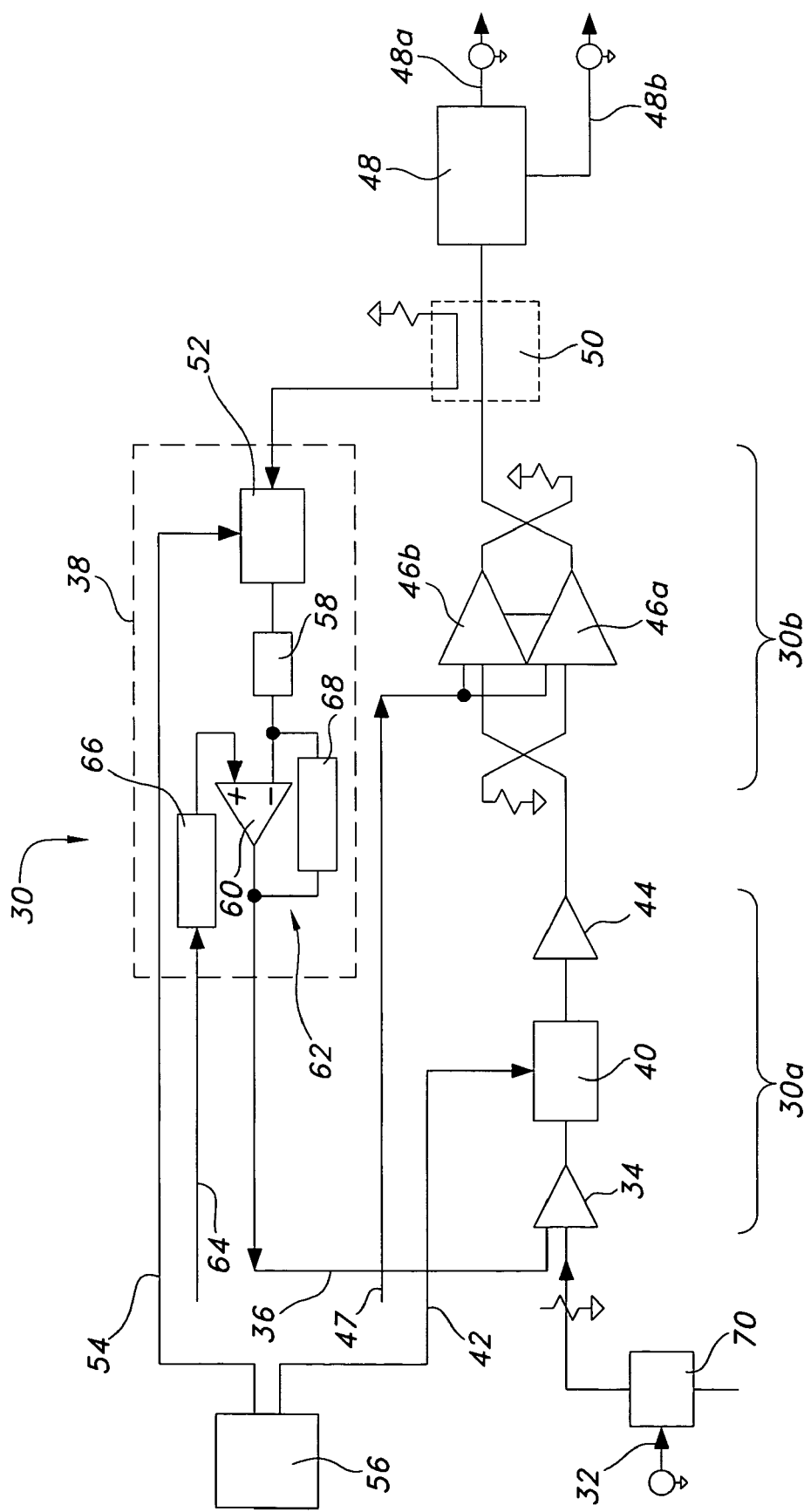
FIG. 1 is a schematic diagram of a digital power amplifier according to the invention.

A schematic representation of a digital power amplifier (PA) according to the invention is depicted in FIG. 1 and is generally indicated by reference number 30. Digital PA 30 comprises a pre-amplifier section 30a, a finals amplifier section 30b, and a negative feedback loop 38. An RF input 32 is input into pre-amplifier section 30a, which includes a variable gain control element 34 that has as its control signal the output 36 of negative feedback loop 38. Negative feedback loop 38 provides output power control as well as pulse waveform control and will be further described herein. Variable gain control element 34 supplies its output to a first digitally controlled attenuator 40. The first digitally controlled attenuator 40 is controlled by a first multi-bit control signal 42 represented by a binary number having three or more bits. In a preferred embodiment first multi-bit control signal 42 has five bits, thereby providing 32 discrete control signal levels. First digitally controlled attenuator 40 provides a predetermined level of attenuation to the RF signal depending upon the value of first control signal 42. The attenuated RF signal is sent through a pre-driver amplifier 44 that boosts the power of the RF signal. Preferably the gain provided by pre-driver amplifier 44 is sufficient to drive the final amplifier section 30b to the maximum RF output power when first digitally controlled attenuator 40 is in the minimum attenuation state.

The boosted RF signal is input into finals amplifier section 30b, which comprises a pair of linearly-biased Laterally Diffused MOS (LDMOS) devices 46a, 46b having gate voltage controlled bias. Together the LDMOS devices provide an additional level of gain to the boosted RF signal. Because the LDMOS devices will have a gain response that changes as the signal power level changes, the bias of the LDMOS devices should be modified from a class AB bias to class A bias as the power of the signal is reduced by first digitally controlled attenuator 40. An LDMOS bias control signal 47 provides instructions to vary the bias of LDMOS devices 46a, 46b depending upon the value of first control signal 42. The bias level necessary for each attenuation value is preferably stored in a digital memory (not shown) and sent to a digital-to-analog converter (not shown) prior to being sent to the LDMOS devices. An antenna interface unit 48 takes the output of the LDMOS devices and processes said output to be sent at 48a to an antenna (not shown) or at 48b to a receiver (not shown).

Prior to being sent to antenna interface unit 48, the output of LDMOS devices 46a, 46b is routed through a coupler 50 that takes a sample of the RF signal. Coupler 50 takes a sample of the signal that is on the order of 1% of the actual signal level so that the actual signal level, as sent to antenna interface unit 48, is substantially unaffected. The sampled signal is supplied as an input to negative feedback loop 38. Negative feedback loop 38 includes a second digitally controlled attenuator 52 that is controlled by a second multi-bit control signal 54 having the same number of bits as first multi-bit control signal 42 and providing the same number of discrete attenuation control levels as the first control signal. Second digitally controlled attenuator 52 provides a predetermined level of attenuation to the sampled signal depending upon the value of the second control signal. FIG. 2 shows the relationship between the attenuation levels provided by first and second control signals 42, 54. When first control signal 42 provides the five-bit signal 00000 to first digitally controlled attenuator 40, second control signal 54 provides the five bit signal 11111 (31) to second digitally controlled attenuator 52. As first control signal 42 supplies increasingly higher attenuation signals, second control signal 54 provides decreasingly lower attenuation signals. As each five-bit signal represents a discrete attenuation step to be applied to an incoming signal, each of the digitally controlled attenuators are configured to provide attenuation steps that are in the reverse order of the attenuation steps provided by the other attenuator. First and second control signals 42, 54 may be advantageously supplied by attenuation control circuitry 56 that provides the appropriate signal levels to the first and second digitally controlled attenuators, respectively, according to the strategy outlined in FIG. 2. Another way to describe the relationship between the attenuation levels provided by the first and second attenuators is to assume there are n discrete attenuation levels that either attenuator can assign, and that k is an integer between and including 1 and n. When the first attenuator applies the $k^{th}$ lowest of the n attenuation levels, the second attenuator applies the $k^{th}$ highest of the n attenuation levels.

Returning to FIG. 1, a detector 58 is configured to detect predetermined signal characteristics within the attenuated RF signal. In a preferred embodiment detector 58 detects the shape or peak of a signal envelope pulse. The detected signal is supplied as an input to a gain control element 60 that forms part of an operational amplifier 62. A reference pulse 64, which may be stored in digital memory (not shown) and converted to an analog signal by a digital-to-analog converter (not shown), is filtered by a reference filter 66 and supplied as the other input to gain control element 60. Feedback circuitry 68 provides the necessary error gain and compensation functions to enable operational amplifier 62 to drive the detected RF signal to match the reference pulse according to known principles. The output of operational amplifier 62 is also output 36 of negative feedback loop 38 and, as previously described, is supplied as a control signal to variable gain control element 34.

Figure 3:
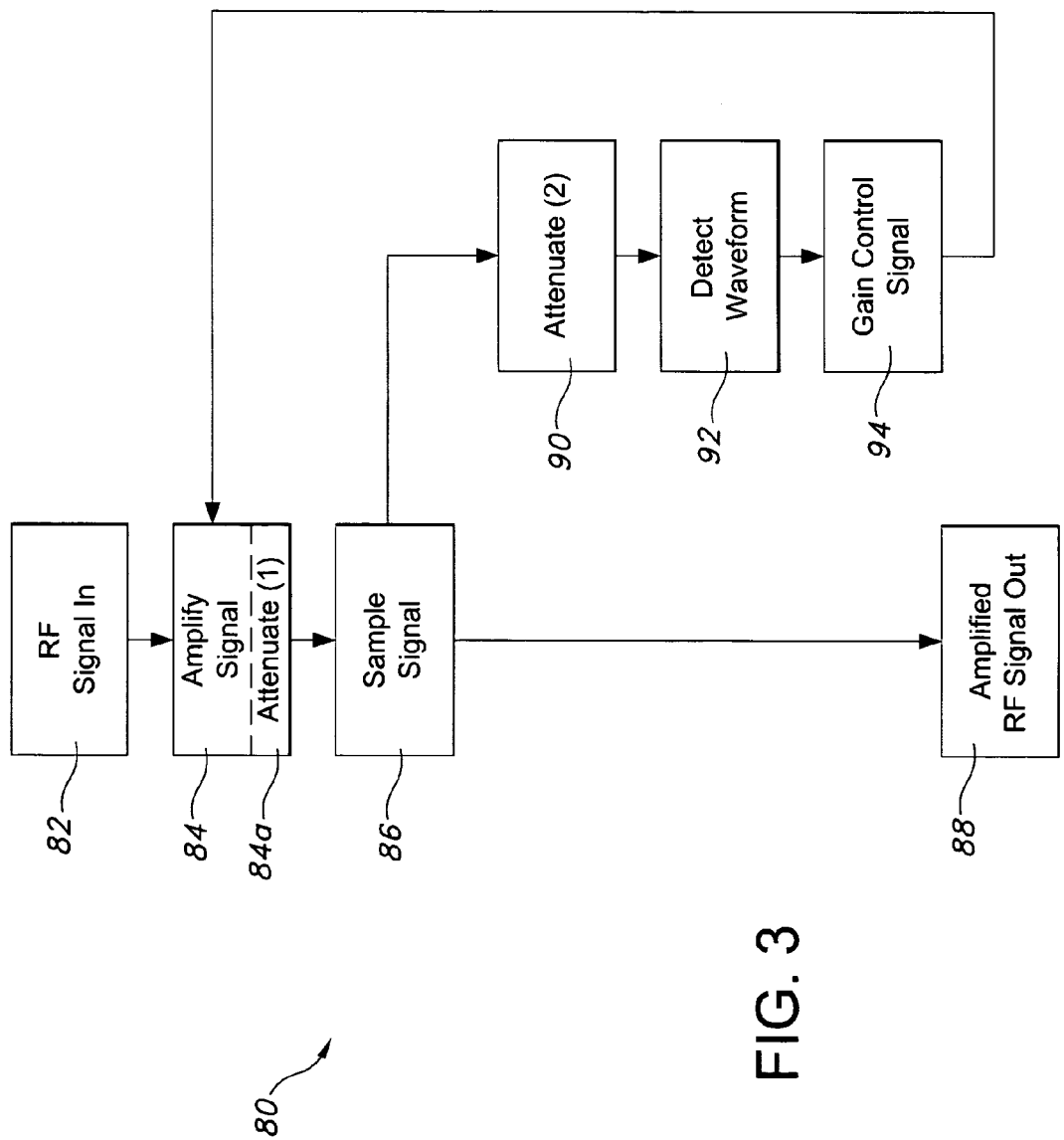
FIG. 3 is a flowchart showing a method according to the invention.
Figure 4:
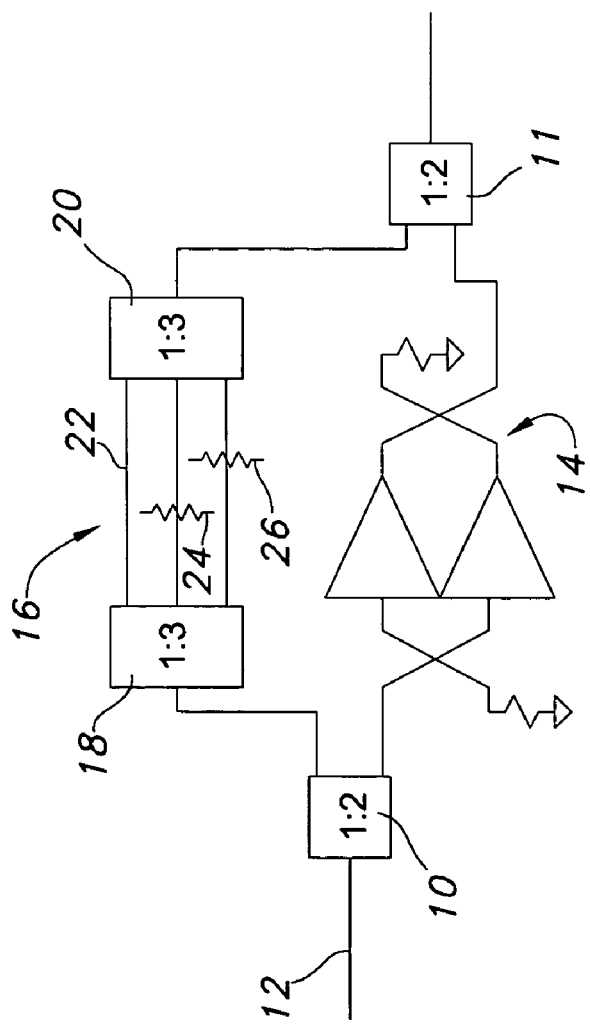
FIG. 4 is a schematic diagram of an attenuation portion of a digital power amplifier using multiple parallel high-power attenuators.

FIG. 3 is a flowchart describing a method 80 according to the invention. In step 82 an RF signal is received. In step 84 the RF signal is amplified using one or more gain control elements. In step 84a, which may be considered a part of step 84, a first attenuation is applied to the RF signal. The first attenuation is one of n discrete attenuation steps. In step 86 a sample is taken of the amplified signal, and in step 88 the amplified signal is output for processing or transmission. In step 90 a second attenuation is applied to the sample of the amplified signal. The second attenuation is another of the n discrete attenuation steps, with the specific relationship between the attenuation steps applied by the first and second attenuations being previously described herein. In step 92 a waveform envelope is detected using appropriate detection circuitry. In step 94 a gain control signal is formed by comparing the detected waveform to an idealized waveform. As shown in FIG. 3, the gain control signal is provided as a control signal to amplifying stage as shown at step 84.

As described herein, the invention provides a digital power amplifier that provides a plurality of attenuated power levels. Among the advantages of the invention is that a wide range in power level control steps are provided. Also, a large number of power levels with small resolution are available.

Another advantage is that the transient response of negative feedback loop 38 is constant with any power level since first and second digitally controlled attenuators 40, 52 are altered by the same amount, resulting in identical closed loop equations.

Still another advantage of the invention is that because second digitally controlled attenuator 52 attenuates the sampled RF signal, RF detector 58 is held at substantially the same detection level regardless of output power levels.

Yet another advantage of the invention is that the voltage controlled gain of LDMOS devices 46a, 46b is always within the same dynamic range with any power level selected. Consequently, a large dynamic range of control is provided to create a well controlled RF pulse regardless of the selected power level. This means that even with low power output levels the dynamic range of variable gain control element 34 remains constant.

Still another advantage is that no high power PIN diode switches or drivers are required. Also, all power level control within the RF signal path is either digital or low-current analog, and external control of PA 30 is also completely digital. This means that size, power and cooling requirements are significantly reduced when compared to known PA systems.

Yet another advantage is that the bias control of LDMOS devices 46a, 46b is configured to act in concert with first and second digitally controlled attenuators 40, 52 to optimize the response of PA 30 for a wide range of power control.

The invention may be varied in many ways while keeping with the spirit of the invention. For example, RF input 32 may be split by a splitter 70 and sent to a second PA (not shown) that resembles digital PA 30. The output of the second PA (not shown) may be sent to a second antenna (not shown) and/or a second receiver (not shown). Other types of gain control elements may be used in pre-amplifier section 30a and finals amplifier section 30b.

While the invention has been disclosed in its preferred form, the specific embodiments thereof as disclosed and illustrated herein are not to be considered in a limiting sense as numerous variations are possible. The subject matter of the invention includes all novel and non-obvious combinations and subcombinations of the various elements, features, functions and/or properties disclosed herein. No single feature, function, element or property of the disclosed embodiments is essential to all of the disclosed inventions. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the invention of the present disclosure.

What is claimed is:

1. A digital power amplifier, comprising:
   an amplifying stage including a first attenuator that applies one of n attenuation steps to an RF signal in response to a desired output power level of the digital power amplifier; and
   a feedback loop that provides a gain control signal to the amplifying stage based upon an output of the amplifying stage, wherein the feedback loop includes a second attenuator that applies another of the n attenuation steps to a sample of the output of the amplifying stage;
   wherein the second attenuator applies the $k^{th}$ highest of the n attenuation steps when the first attenuator applies the $k^{th}$ lowest of the n attenuation steps, where $1 \leq k \leq n$.

2. The digital power amplifier of claim 1, wherein the amplifying stage includes a variable gain control element, controlled by the gain control signal, that provides a variable gain to the RF signal prior to the RF signal being attenuated by the first attenuator.

3. The digital power amplifier of claim 2, further including a bias-controlled gain element that provides a signal gain to the RF signal after the RF signal is attenuated by the first attenuator, said bias-controlled gain element being controlled by a bias control signal that varies according to which of the n attenuation steps is selected to be applied by the first attenuator.

4. The digital power amplifier of claim 1, wherein the feedback loop further includes an RF signal detector that detects a characteristic of a predetermined waveform after the second attenuator has attenuated the sample of the output of the amplifying stage, and further wherein the RF signal detector is maintained at a substantially constant detection level regardless of the desired output power level.

5. The digital power amplifier of claim 4, wherein the feedback loop further includes an operational amplifier that drives the detected characteristic of the predetermined waveform to match an ideal characteristic of the predetermined waveform pattern.

6. The digital power amplifier of claim 4, wherein the predetermined characteristic is a signal envelope representing a maximum value of the attenuated RF signal over time.

7. The digital power amplifier of claim 1, wherein the first and second attenuators are digital attenuators, and further including attenuation control circuitry that provides first and second digital control signals, respectively, to the first and second digital attenuators.

8. A digital power amplifier with variable output power control, comprising:
   means for amplifying an RF signal, the means for amplifying including a first means for attenuating the RF signal, wherein the first means for attenuating applies one of n attenuation steps to the RF signal in response to a desired output power level of the digital power amplifier; and
   means for providing gain control to the means for amplifying, the means for providing gain control based upon an output of the means for amplifying, wherein the means for providing gain control includes a second means for attenuating that applies another of the n attenuation steps to a sample of the output of the means for amplifying;
   wherein the second means for attenuating applies the $k^{th}$ highest of the n attenuation steps when the first means for attenuating applies the $k^{th}$ lowest of the n attenuation steps, where $1 \leq k \leq n$.

9. The digital power amplifier of claim 8, wherein the means for amplifying includes a variable gain control element, controlled by the gain control signal, the variable gain control element providing a variable gain to the RF signal prior to the RF signal being attenuated by the first means for attenuating.

10. The digital power amplifier of claim 9, further including means for providing a bias-controlled gain that provides a signal gain to the RF signal after the RF signal is attenuated by the first attenuator, said means for providing a bias-controlled gain being controlled by a bias control signal that varies according to which of the n attenuation steps is selected to be applied to the RF signal by the first means for attenuating.

11. The digital power amplifier of claim 8, wherein the means for providing gain control further includes means for detecting that detects a characteristic of a predetermined waveform of the RF signal after the second means for attenuating has attenuated the sample of the output of the means for amplifying, and further wherein the means for detecting is maintained at a substantially constant detection level regardless of the desired output power level.

12. The digital power amplifier of claim 11, wherein the means for providing gain control further includes an operational amplifier that drives the detected characteristic of the predetermined waveform to match an ideal characteristic of the predetermined waveform pattern, wherein an output of the operational amplifier is a gain control signal provided to the means for amplifying.

13. The digital power amplifier of claim 11, wherein the predetermined characteristic is a signal envelope representing a maximum value of the attenuated RF signal over time.

14. The digital power amplifier of claim 8, wherein the first and second means for attenuating are first and second digital attenuators, respectively, and further including attenuation control circuitry that provides first and second digital control signals, respectively, to the first and second digital attenuators.

15. A method of controlling an output power level of a digital power amplifier, the method comprising:
  amplifying an RF signal using at least one gain controlling element;
  while amplifying the RF signal, applying a first attenuation to the RF signal with one of n attenuation steps in response to a desired output power level; and
  providing a gain control signal, based upon an output of the amplifying step, to one of the at least one gain controlling elements, wherein providing the gain control signal includes applying a second attenuation to a sample of the output of the amplifying step using another of the n attenuation steps;
  wherein the applying of the second attenuation operates to apply the $k^{th}$ highest of the n attenuation steps when the applying of the first attenuation operates to apply the $k^{th}$ lowest of the n attenuation steps, where $1 \leq k \leq n$.

16. The method of claim 15, wherein the one of the at least one gain controlling elements is a variable gain control element, controlled by the gain control signal, that provides a variable gain to the RF signal prior to the first attenuation being applied to the RF signal.

17. The method of claim 16, wherein the at least one gain controlling element further includes a bias-controlled gain element that provides a signal gain to the RF signal after the first attenuation is applied to the RF signal, said bias-controlled gain element being controlled by a bias control signal that varies according to which of the n attenuation steps is selected to be applied during the first attenuation.

18. The method of claim 15, wherein the feedback loop further includes detecting a characteristic of a predetermined waveform after the second attenuation has been applied to the sample of the output of the amplifying step, and further including maintaining the detecting at a substantially constant detection level regardless of the desired output power level.

19. The method of claim 18, wherein the providing a gain control signal further includes driving the detected characteristic of the predetermined waveform to match an ideal characteristic of the predetermined waveform pattern.

20. The method of claim 15, further including providing a digital control signal to control the first and second attenuations.

* * * * *